United States Patent [19]
Sorimachi et al.

[11] Patent Number: 5,432,675
[45] Date of Patent: Jul. 11, 1995

[54] MULTI-CHIP MODULE HAVING THERMAL CONTACTS

[75] Inventors: Haruo Sorimachi; Kiyotaka Seyama; Makoto Sumiyoshi; Kazuaki Satoh, all of Kawasaki, Japan

[73] Assignee: Fujitsu Limited, Kawasaki, Japan

[21] Appl. No.: 151,871

[22] Filed: Nov. 15, 1993

[51] Int. Cl.⁶ .............................. H05K 7/20
[52] U.S. Cl. .................. 361/719; 174/261; 257/700; 361/705; 361/795
[58] Field of Search ............. 361/704, 707, 705, 712, 361/713, 715, 718, 719, 749, 760, 767, 774, 776, 778, 783, 792, 795; 174/252, 254, 260, 261, 262, 263, 52.1, 52.2, 52.4; 165/80.3, 185; 257/692, 698, 700, 704, 712, 713, 720, 723

[56] References Cited

U.S. PATENT DOCUMENTS

| | | | |
|---|---|---|---|
| 4,667,401 | 5/1987 | Clements | 29/832 |
| 4,729,061 | 3/1988 | Brown | 361/386 |
| 4,783,695 | 11/1988 | Eichelberger | 357/65 |
| 4,963,697 | 10/1990 | Peterson | 361/792 |
| 5,121,299 | 6/1992 | Frankeny | 361/413 |
| 5,161,093 | 11/1992 | Gorczyca | 361/414 |
| 5,227,812 | 7/1993 | Watanabe | 346/140 R |

Primary Examiner—Gerald P. Tolin
Attorney, Agent, or Firm—Staas & Halsey

[57] ABSTRACT

A multi-chip module (MCM) having semiconductor chips on a top surface of multi-layered interconnection circuits formed on a planar surface of a substrate including: (a) multi-layered interconnection circuits comprising alternatively laminated interconnection layers with insulating layers, and thermal contacts, each of the thermal contacts comprising successively laminated interconnection layers on a bottom and on side-walls of a vertical hole penetrating a plurality of the insulating layers, and a thermal conductor filling the vertical hole on the successively laminated interconnection layers, and (b) a plurality of the semiconductor chips attached to the thermal conductor. In a preferred embodiment, a V-shaped vertical hole is formed in the insulating layers of polyimide for a thermal contact, copper films are successively laminated thereon, unpatterned copper and gold films are deposited thereon, and the entire surface of the metal film including the hole is coated by a silver-powder containing epoxy film, to which semiconductor chips are adhered.

13 Claims, 5 Drawing Sheets

MULTI-CHIP MODULE HAVING THERMAL CONTACTS

BACKGROUND OF THE INVENTION

1. Field of the Invention

The present invention relates to a multi-chip module (call MCM hereafter), and more particularly to an MCM wherein a conventional thermal pillar is eliminated.

2. Description of the Prior Art

FIG. 2 shows a cross-sectional view of a conventional three-layered MCM having a typical thermal pillar. The thermal pillar consists of patterned metal layers $2a \sim 2c$ and each vertical metal column 7 on them penetrating each polyimide film 3. Heat generated by semiconductor chips 6 is collected by an uppermost metal layer $2d$ of the multi-layered interconnection circuits, through intermediate layers 4 and 5, and transfered by the thermal pillar to the patterned bottom metal layer $2a$ in the lowest layer to be dissipated into an electrically insulating substrate 1. A conventional thermal pillar is usually fabricated, layer by layer, by repeating a series of processing steps for each circuit layer. It comprises steps of depositing each metal layer $2a \sim 2c$ on each insulating layer $3a \sim 3c$, forming a metal column 7 by selective plating, patterning of the metal layer by anisotropic etching, forming a polyimide layer over the metal column 7, and polishing it for planarization. These are mostly extra processing steps, and particularly, the selective plating of metal column 7 is not compatible to processing steps for the multi-layered interconnection circuits. Furthermore, this is costly and time-consuming work, which has been a long-time obstacle for simplifying the fabrication process of MCM's.

SUMMARY OF THE INVENTION

It is a primary object of the present invention to provide an MCM wherein the conventional thermal pillar requiring a selective metal plating process is eliminated.

It is another object of the present invention to provide an MCM having metal interconnection layers being laminated on the inside wall of the vertical hole so as to transfer heat generated by the semiconductor chip to the substrate as a heat sink.

It is further object of the present invention to provide an MCM having a thermal contact to the substrate by laminating the interconnection layer on the inside wall of the vertical hole, which is formed by processing steps compatible to those for other parts of the multi-layered interconnection circuits.

For these purposes, the present invention provides an MCM having the following features:

1. A multi-chip module having semiconductor chips on a top surface of multi-layered interconnection circuits formed on a planar surface of a substrate comprising;
   (a) a plurality of the semiconductor chips attached to an uppermost interconnection layer with a thermal contact,
   (b) a set of interconnection layers separated from each other by insulating layers therebetween,
   (c) a vertical hole penetrating a plurality of the insulating layer, and
   (d) the interconnection layers being laminated to each other on a bottom of the vertical hole so as to transfer heat generated by the semiconductor chip to the substrate.
2. The multi-chip module according to item 1, wherein the interconnection layers are laminated to each other on a bottom of the vertical hole are extended over the planar upper surface of each insulating layer, respectively.
3. The multi-chip module according to item 1, wherein the interconnection layers are successively laminated to each other on a bottom of the vertical hole.
4. The multi-chip module according to item 1, wherein each interconnection layers is selected from the group of sandwich-structured chromium-copper-chromium and aluminum.
5. The multi-chip module according to item 1, wherein the semiconductor chips adhere to the uppermost interconnection layer by materials selected from the group of organic plastics with silver powder, and soldering metals.
6. The multi-chip module according to item 1, wherein the insulating layers are made of a material selected from the group of polyimide, epoxy, and teflon.
7. The multi-chip module according to item 1, wherein the insulating layers are made of photosensitive polyimide.
8. The multi-chip module according to item 1, wherein the uppermost layers are thicker than others.
9. The multi-chip module according to item 1, wherein the semiconductor chip is attached to the interconnection layer with a thermal contact by metal bumps formed on the vertical hole of the uppermost metal layer.
10. The multi-chip module according to item 1, wherein the vertical hole has such a cross-section that an upper opening is wider than any of the lower opening.

According to the present invention, it is expected that since an MCM has interconnection layers being laminated on a bottom of the vertical hole, which is wider in the upper layer than in the lower one, and that the hole is filled with organic plastics or soldering metals, heat generated by the semiconductor chip is effectively collected and quickly transfered to the insulating substrate. A thicker laminated metal layer on the bottom of the vertical hole compensates a decrease in the vertical thermal conductivity that would otherwise be resulted in because the vertical hole in the lower layer is narrower than that in the upper layer. Furthermore, it is also expected that since the MCM has no conventional thermal pillar, it can be fabricated by the usual processing steps without a selective metal plating process.

DESCRIPTION OF THE PREFERRED EMBODIMENTS

The preferred embodiments of the present invention will now be described in detail with illustrations.

Referring to FIGS. 3(a) through 3(e), each fabrication processing step of the interconnection layer having the vertical hole related to the first embodiment according to the present invention is illustrated.

Figure 3A:
FIG. 3(a) through 3(e) are schematic cross-sectional views of interconnection layers having the vertical hole in each processing step related to the first embodiment according to the present invention.

As shown in FIG. 3(a), an initial electrically insulating substrate 1 is a mirror-polished aluminum nitride(AlN) square-shaped wafer of 1.5 mm thick, which has a good thermal conductivity and a thermal expansion coefficient compatible to the semiconductor chip on it. After cleaning the surface of the substrate, the first metal layer consisting of 0.1 $\mu$m thick chromium (Cr), 5.0$\mu$thick copper, and 0.1 $\mu$m thick chromium (Cr) were grown successively in situ over the entire surface of the substrate in a vacuum chamber by DC magnetron-sputtering, and patterned by photolithography using an etchant consisting of potassium ferro-cyanide ($K_3Fe(CN)_6$) and potassium hydroxide for chromium etching, and an etchant consisting of sulfuric acid and diluted hydrogen peroxide for copper etching. Thus, the first metal land 2a is deliniated together with the first interconnection layer (not shown).

Figure 3B:
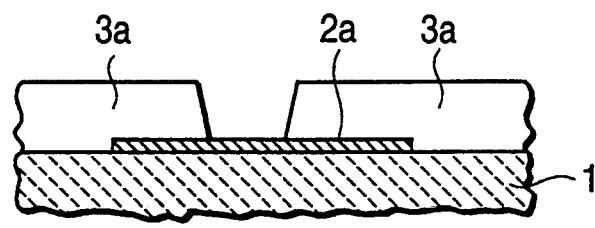

As shown in FIG. 3(b), a precursory varnish of photosensitive polyimide was spin-coated. Thickness of the polyimide film is determined by considering the characteristic impedance of the interconnection layers. The cured polyimide film was selected to be 20 $\mu$m thick in the lowest layer 3a. A via hole of about 40 $\mu$m in diameter was formed in the photo-sensitive polyimide layer and the layer was cured at 360° C. for an hour.

Figure 3C:
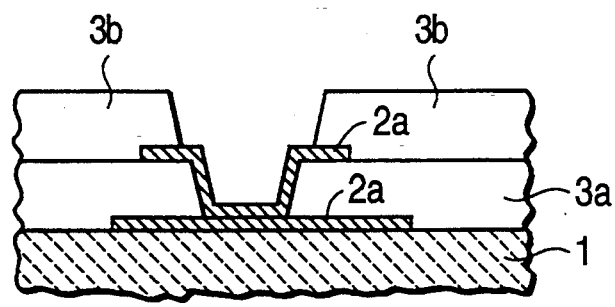

As shown in FIG. 3(c), similarly to the above steps, the second land 2b was formed over the exposed surface of the first land 2a and the side-wall of the via hole extending over the planar upper surface of the polyimide film, together with the second interconnection layer (not shown). The diameter of the second land 2b was needed to be larger by about 30 $\mu$m in diameter than that of the polyimide via hole for photolithographic allowance.

Figure 3D:
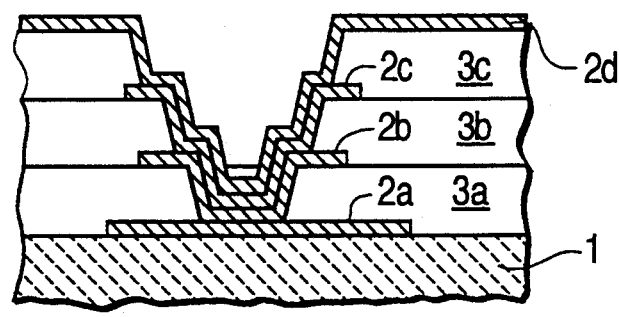

As shown in FIG. 3(d), the three-layered interconnection layer was formed where the via hole was larger in the upper layer than that in the lower layer according to photolithographic convenience.

Figure 3E:
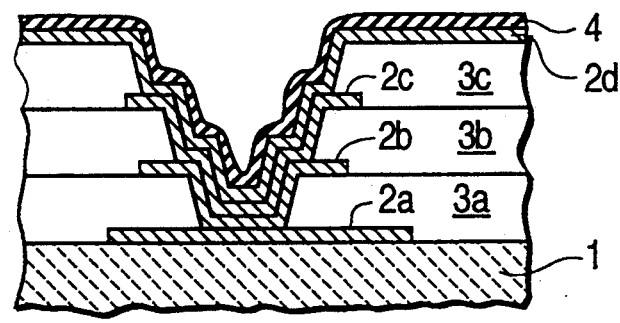

As shown in FIG. 3(e), the uppermost metal layer 4 consisting of 1 $\mu$m thick gold and 2$\mu$thick nickel was formed over the entire surface of the unpatterned metal layer by electrolytic plating method for reliability in electric contact. The electrolytic plating was carried out by supplying the electric current through the underlayered metal 2d before it was pattered.

Figure 1:
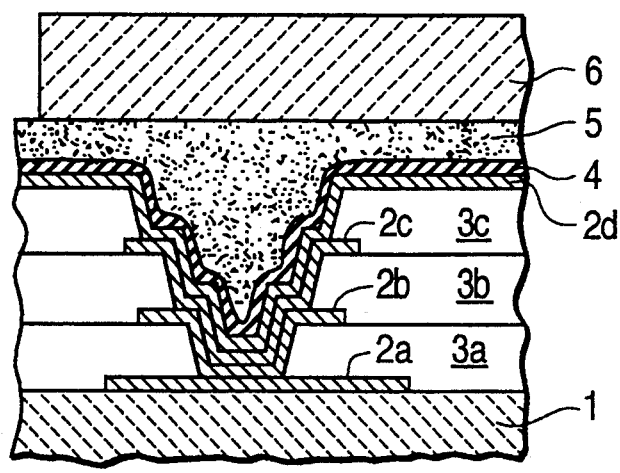
FIG. 1 is a schematic cross-sectional view of a multi-chip module having multi-layered interconnection circuits with a vertical hole wherein interconnection layers are laminated and which is filled with organic plastics related to the first embodiment according to the present invention.
Figure 2:
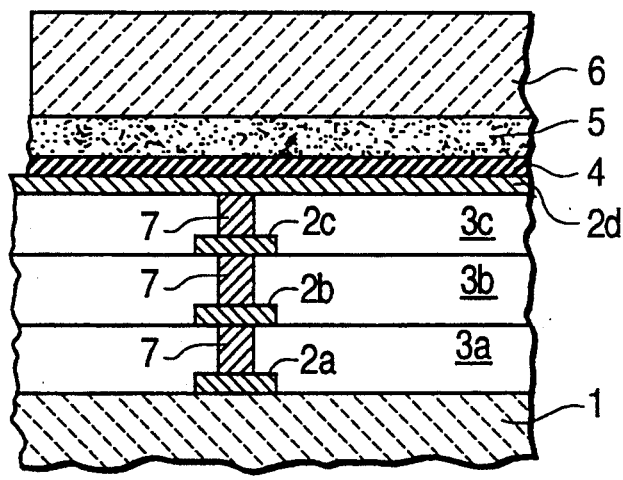
FIG. 2 is a schematic cross-sectional view of a multi-chip module having multi-layered interconnection circuits with the conventional thermal pillar according to a prior art.

In the final step, there are several choices how the semiconductor chips are assembled to multi-layered interconnection circuits. In the first embodiment of the present invention as shown in FIG. 1, the vertical hole was filled with which contains silver powder epoxy 5 whereby the semiconductor chip 6 adheres to the surface of the uppermost metal layer 4. The epoxy contains silver powder and can be replaced by soldering metal or other organic plastics. Depending upon the material 5, the uppermost metal layer 4 is varied in materials and its thickness. It should be noticed that the thicker laminated metal layer on the bottom of the vertical hole contributes to lowering the thermal resistivity there to allow the heat flow into the substrate efficiently because soldering metals and organic plastics are much lower in thermal conductivity by factor of one and two, respectively than metal layers. Since the plating metal layer 4 is formed thicker on the bottom of vertical hole than on the planar surface of the uppermost metal layer, the same effect is expected.

Figure 4A:
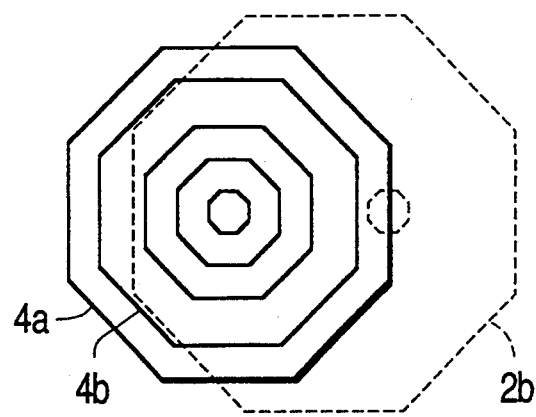
FIG. 4(a) is a top plan view of interconnection layers having the vertical hole related to the second embodiment according to the present invention.
Figure 4B:
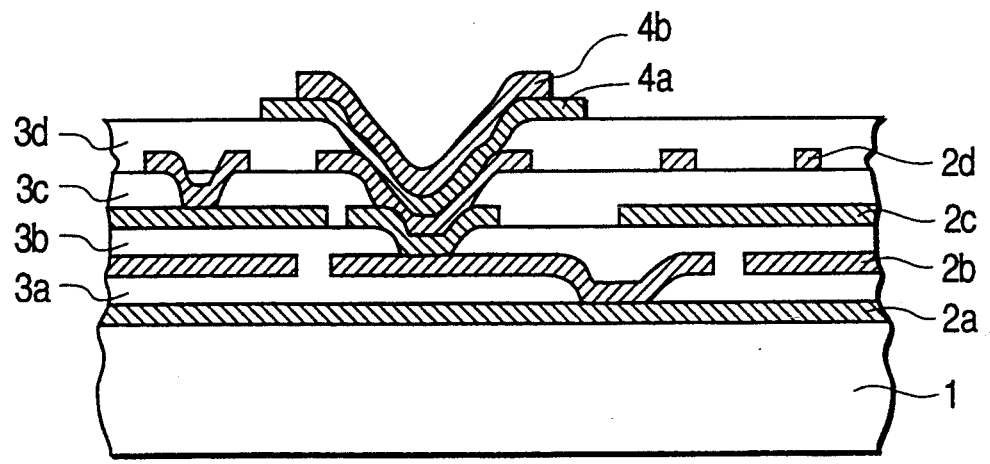
FIG. 4(b) is a cross-sectional view of FIG. 4(a).

Referring to FIGS. 4(a) and 4(b), a schematic plan view and its cross-sectional one of the interconnection layer having the vertical hole related to the second embodiment according to the present invention are illustrated, respectively. Although the fabrication processing steps are same as those of the first embodiment, the characteristic feature is a structural one in which the bottom of the metal land 2c in the upper part of the interconnection layer is ended on the planar upper part of the underlayered metal land 2b. As shown in this embodiment, a successive increase in a diameter of the via hole for the upper layer can be avoided by adopting an off-centered structure. This approach is particularly useful with increasing a number of the interconnection layers.

Figure 5:
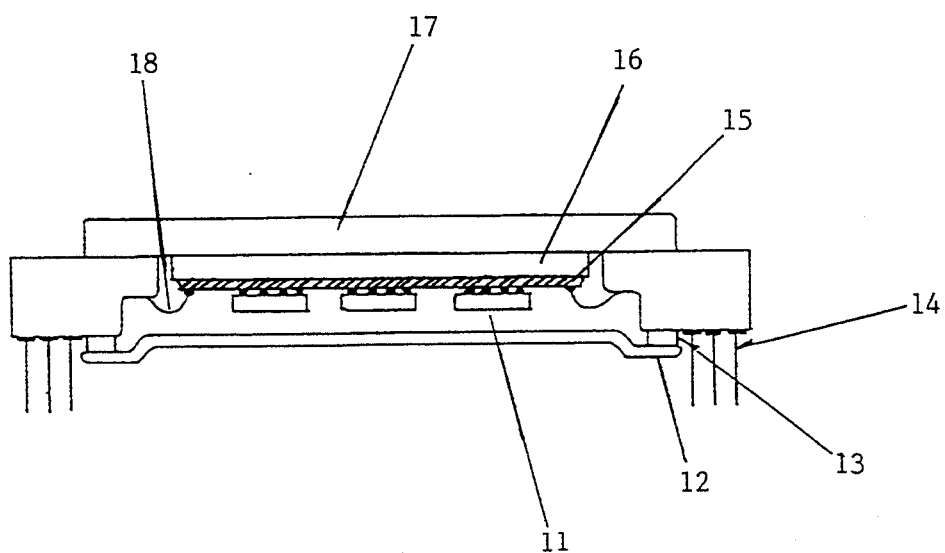
FIG. 5 is a schematic cross-sectional view of a typical multi-chip module (MCM) wherein the semiconductor chips are attached to the interconnection layer by soldering metal bumps related to the third embodiment according to the present invention.

Referring to FIG. 5, a schematic cross-sectional view of a typical multi-chip module (MCM) related to the third embodiment according to the present invention is illustrated. A multi-interconnection layer 15 formed on an AlN substrate 16 is assembled with a PGA type package. A difference from the conventional semiconductor package is a large copper-tungsten (Cu—W) plate 17, on the top surface of which a fin is usually formed for cooling (not shown). In this embodiment, semiconductor chips 11 are assembled by flip-chip method. The soldering metal bumps already formed on the main surface of the chips are attached to the vertical hole of the interconnection layer 15. The interconnection layer is electrically connected by wires 18 to metal leads on the package which is internally connected to pins 14. A metal lid 12 is attached to the package by shield 13 to protect the chips and bonded wires.

In the above embodiments, an AlN substrate was used. However, the substrate material is not limited to an insulator, but other materials are available such as silicon, gallium-arsenide, aluminum, or tungsten, of which electric characteristics can be utilized as well as its thermal characteristics.

What is claimed is:

1. A multi-chip module having semiconductor chips on a top surface of multi-layer interconnection circuits formed on a planar surface of a substrate comprising:
    (a) a plurality of the semiconductor chips attached to an uppermost interconnection layer having a thermal contact;
    (b) a set of interconnection layers laminated alternatively with insulating layers except for an area of the thermal contact;
    (c) a plurality of the insulating layers each having a vertical hole having a sidewall in the area of the thermal contact;

(d) the interconnection layers laminated successively on a bottom and side walls of the vertical hole so that the depth of the interconnection layers is increased successively as each subsequent interconnection layer covers the preceding interconnection layers on the bottom and along the side walls of the vertical hole from an upper layer to a lower layer of the insulating layers; and (e) the thermal contact formed by the interconnection layers laminated successively on a bottom and on side walls of the vertical hole and by a thermal conductor filling a remaining volume of the vertical hole.

2. The multi-chip module according to claim 1, wherein each of the interconnection layers extends over a planar upper surface of each insulating layer, respectively.

3. The multi-chip module according to claim 1, wherein all of the interconnection layers are successively laminated on the bottom of the vertical hole.

4. The multi-chip module according to claim 1, wherein each of the interconnection layers is selected from the group of sandwich-structured chromium-copper-chromium and aluminum.

5. The multi-chip module according to claim 1, wherein the semiconductor chips adhere to the uppermost interconnection layer by a thermal conductor selected from the group of organic plastics with silver powder, and of soldering materials.

6. The multi-chip module according to claim 1, wherein the insulating layers are made of a material selected from the group of polyimide, epoxy, and teflon.

7. The multi-chip module according to claim 1, wherein the insulating layers are made of photosensitive polyimide.

8. The multi-chip module according to claim 1, wherein the uppermost interconnection layers is thicker than any of the preceding interconnection layers.

9. The multi-chip module according to claim 1, wherein the semiconductor chip is attached to the uppermost interconnection layer by metal bumps formed on the thermal contact.

10. The multi-chip module according to claim 1, wherein a diameter of the vertical hole in an upper layer of the insulating layers is larger than a diameter of the vertical hole in a lower layer.

11. The multi-chip module according to claim 1, wherein the thermal conductor adheres to the semiconductor chips.

12. The multi-chip module according to claim 9, wherein the metal bumps formed on a main surface of the semiconductor chip are formed integrally with the semiconductor chip.

13. The multi-chip module according to claim 1, wherein:
(a) a first thermal contact ends on a planar upper part of an underlayered interconnection layer;
(b) the underlayered interconnection layer is connected to an upper interconnection layer of a second thermal contact; and
(c) a center of the first thermal contact is different from a center of the second thermal contact.

* * * * *

UNITED STATES PATENT AND TRADEMARK OFFICE
CERTIFICATE OF CORRECTION

PATENT NO. : 5,432,675
DATED : July 11, 1995
INVENTOR(S) : Sorimachi et al

It is certified that error appears in the above-indentified patent and that said Letters Patent is hereby corrected as shown below:

Col. 1, line 16, change "2a-2cand" to --2a - 2c and--.

Col. 2, line 32, insert --uppermost-- after "the", second occurrence.

Col. 2, line 39, change "opening" to --openings--.

Col. 3, line 28, change "5.0µthick" to -5.0µm thick--.

Col. 3, line 52, delete "was".

Col. 3, line 60, change "2µthick" to --2µm thick--.

Col. 4, line 2, delete "epoxy 5" after "powder" and insert --epoxy 5-- after "with".

Signed and Sealed this

Third Day of October, 1995

BRUCE LEHMAN

Attest:

Attesting Officer

Commissioner of Patents and Trademarks